United States Patent
Adachi et al.

(10) Patent No.: US 7,306,384 B2
(45) Date of Patent: Dec. 11, 2007

(54) PROCESSING APPARATUS FOR LITHOGRAPHIC PRINTING PLATE AND PROCESS FOR PROCESSING THE SAME

(75) Inventors: Keiichi Adachi, Haibara-gun (JP); Hisao Kanzaki, Haibara-gun (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 174 days.

(21) Appl. No.: 11/210,748

(22) Filed: Aug. 25, 2005

(65) Prior Publication Data

US 2006/0042491 A1    Mar. 2, 2006

(30) Foreign Application Priority Data

Aug. 27, 2004    (JP)    ............... 2004-248455

(51) Int. Cl.
*G03D 5/06*    (2006.01)
*B41N 3/00*    (2006.01)

(52) U.S. Cl. .................. 396/606; 396/611; 396/614; 101/463.1

(58) Field of Classification Search ................. 396/606, 396/612, 614, 611; 430/302; 101/463.1; 492/30–37; 15/77, 102
See application file for complete search history.

(56) References Cited

U.S. PATENT DOCUMENTS

| | | | | |
|---|---|---|---|---|
| 2,839,785 A | * | 6/1958 | Stevens | ................. 425/71 |
| T892,011 I4 | * | 11/1971 | Gustafson et al. | ...... 134/122 R |
| 3,916,426 A | * | 10/1975 | Bown | .................. 396/614 |
| 4,733,422 A | * | 3/1988 | Schramm et al. | ............ 15/77 |
| 5,109,246 A | * | 4/1992 | Yamamoto et al. | ......... 396/607 |
| 5,805,949 A | * | 9/1998 | Nozawa et al. | ............ 396/612 |
| 6,547,461 B1 | * | 4/2003 | Matsuda et al. | ........... 396/614 |
| 6,655,860 B2 | * | 12/2003 | Nozawa et al. | ............ 396/614 |
| 6,793,418 B1 | * | 9/2004 | Fromson et al. | ........... 396/602 |
| 2002/0174881 A1 | * | 11/2002 | Bliven et al. | .................. 134/6 |

FOREIGN PATENT DOCUMENTS

| | | |
|---|---|---|
| JP | 2003-5379 | 1/2003 |
| JP | 2003-107684 | 4/2003 |

* cited by examiner

*Primary Examiner*—W. B. Perkey
(74) *Attorney, Agent, or Firm*—Buchanan Ingersoll & Rooney PC

(57) ABSTRACT

A processing apparatus for a lithographic printing plate, which has a photosensitive material coated thereon and has an image formed with an FM screen or a high definition AM screen, by a developing part and a rinsing part in this order, in which a concavo-convex part or grooves are provided on a lower roller of a pair of feeding roller at a feeding port of the rinsing part.

20 Claims, 5 Drawing Sheets

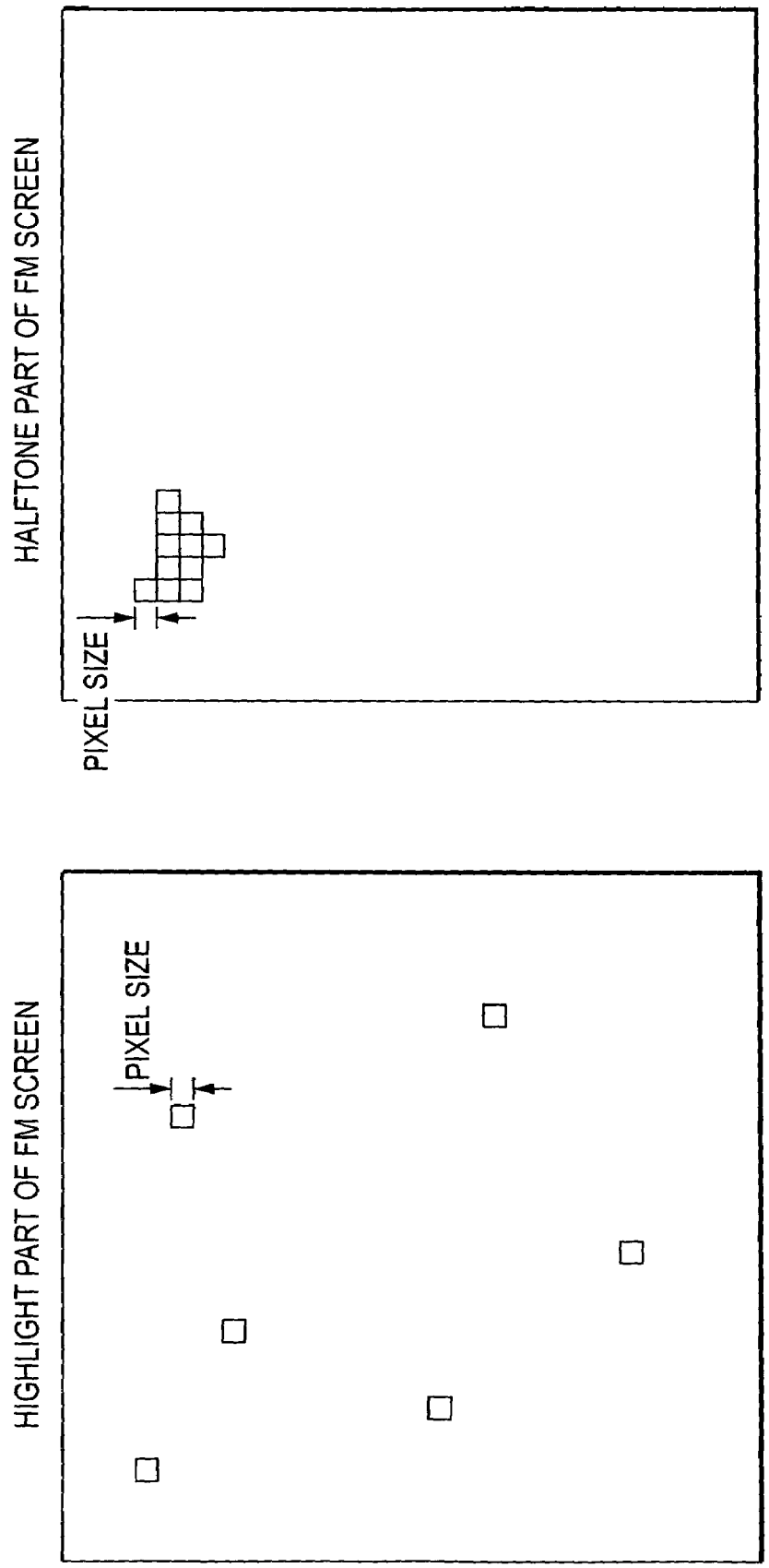

PROCESSING APPARATUS FOR LITHOGRAPHIC PRINTING PLATE AND PROCESS FOR PROCESSING THE SAME

BACKGROUND OF THE INVENTION

1. Technical Field of the Invention

The present invention relates to such a processing apparatus for a lithographic printing plate that is particularly effective for processing a lithographic printing plate having an image formed with a high definition AM screen or an FM screen. More specifically, the invention relates to a processing apparatus for a lithographic printing plate containing a photothermal conversion agent and being exposed with laser in a heat mode.

2. Description of the Related Art

In general, a photosensitive lithographic printing plate is developed with a photosensitive lithographic processing apparatus (hereinafter, sometimes referred to as a printing plate processor). The developing process in the printing plate processor is carried out in such a manner that a photosensitive lithographic printing plate having an image recorded therein is immersed in a developing solution retained in a developing bath by conveying the printing plate to the developing bath, and the photosensitive layer in an area having no image formed of the photosensitive lithographic printing plate is removed by a scrubbing means, such as a rotating brush roller, provided in the developing solution. In the printing plate processor, the photosensitive lithographic printing plate having been subjected to the developing step with the developer solution is rinsed with rinsing water in a rinsing part (rinsing step), and then subjected to a moistening treatment by coating a gum solution in a moistening part. The rinsing part contains feeding and ejecting rollers and a spray pipe, and the lithographic printing plate is rinsed by spraying rinsing water thereon from the spray pipe after passing through the feeding rollers.

In recent years, the prepress systems including a thermal plate is becoming to handle high definition images, and high definition images having a large halftone dot line number with an AM screen and image patterns with a small minimum pixel size with an FM screen are being brought into the market.

As the photosensitive lithographic printing plate, a conventional negative or positive printing plate has been used, but according to the progress of a computer-to-plate (CTP) system in recent years, systems using a photopolymer plate or a thermal plate are frequently employed. In particular, a thermal plate exposed in a heat mode is significantly advanced. It is disclosed in, for example, JP-A-2003-5379 and JP-A-2003-107684 as a related art.

However, the rinsing water is discharged from the spray pipe in the rinsing part hits against the upper and lower rollers at the feeding part of the rinsing part, and runs around the rollers to intrude into the side of the developing part, and as a result, the rinsing water is accumulated in the meniscus of the feeding rollers. Upon carrying on the lithographic printing plate from the developing part to the rinsing part, there are cases where the rinsing water is carried onto the plate to cause dripping.

It has been known that the upper feeding roller in the rinsing part is generally provided with a liquid cutting member for cutting the rinsing water running around the upper roller, and for example, a metallic bar is provided. However, the lower roller is not provided with a liquid cutting member, and the rinsing liquid running around the lower roller causes dripping.

The development of the lithographic printing plate slightly proceeds until the printing plate is conveyed to the rinsing part although the developing solution is squeezed with squeezing rollers at the ejection port of the developing part.

In the case where dripping of the rinsing liquid occurs on the lithographic printing plate from the feeding rollers of the rinsing part to the side of the developing part, the development slightly proceeding is suppressed on the dripping part. As a result, the dripping part has a density different from the surroundings to cause image unevenness. In the case where a thermal positive plate is used, for example, the density on the dripping part is increased. In the case of a high definition AM screen image or FM screen image having a large circumferential length, the extent of image unevenness is further deteriorated due to the larger change in density on progress of development.

In particular, the thermal plate is liable to change in halftone dot area depending on the extent of development progress, and thus the image unevenness is liable to occur. Accordingly, it is necessary to effect a uniform developing treatment.

SUMMARY OF THE INVENTION

One object of the invention is to prevent image unevenness from occurring due to dripping in a rinsing part of a development system, which is intended to achieve uniform developing of a lithographic printing plate.

To obtain this and other objects, one aspect of the invention relates to a processing apparatus for a lithographic printing plate comprising: a developing process part and a rinsing process part so that the lithographic printing plate is subjected to a developing process and a rinsing process in this order, the rinsing process part comprising a pair of feeding rollers for holding and conveying the printing plate at a feeding port of the rinsing process part. The lower roller of the pair of feeding rollers has a concavo-convex surface comprising a convex part and a concave part, and the concave part has a depth of 100 µm or more and a width of 100 µm or more.

In a further aspect of the invention, a process for processing a lithographic printing plate is provided. The process comprises the steps of:

exposing the lithographic printing plate comprising one of a photosensitive layer and a heat-sensitive layer with laser through a high definition AM screen having 250 lines or more or a high definition FM screen having a minimum pixel size constituting halftone dots of 50 µm or less;

developing the lithographic printing plate by conveying into a developing solution;

rinsing the lithographic printing plate; and finishing the lithographic printing plate, wherein concavo-convex surface comprising a convex part and a concave part is formed on a lower roller of a pair of feeding rollers which hold and covey the lithographic printing plate ejected from an ejecting roller after completing the developing step, and a rinsing liquid is made to flow into the concave part, and wherein the concave part has a depth of 100 µm or more and a width of 100 µm or more.

In additional aspects, the concave and convex parts are further defined, such as in terms of form and dimensions, and the lithographic plate is set forth in greater detail.

By using a roller having a concavo-convex surface as the lower roller of the feeding rollers of the rinsing part of the printing plate processor, whereby dripping on the plate surface from the feeding rollers of the rinsing part is prevented from occurring, one can avoid image unevenness, which is a problem upon producing a printing plate of a high definition image. Furthermore, the rinsing water is prevented from flowing into the developing bath, whereby changes in the development process, such as reduction in sensitivity due to dilution of the developing solution, can be prevented. Accordingly, a lithographic printing plate can be processed in a printing plate processor without occurrence of image unevenness.

BRIEF DESCRIPTION OF THE DRAWINGS

FIGS. 2A and 2B are schematic cross sectional views showing the states of rinsing with the upper and lower feeding rollers, in which FIG. 2A shows the state using the upper and lower feeding rollers according to the invention, and FIG. 2B shows the state using the upper and lower feeding rollers of the conventional apparatus.

FIGS. 4A and 4B are diagrams for describing the minimum pixel size referred in the invention, in which FIG. 4A shows the minimum pixel found in a highlight part, and FIG. 4B shows the minimum pixel found in a halftone part.

Figure 1:
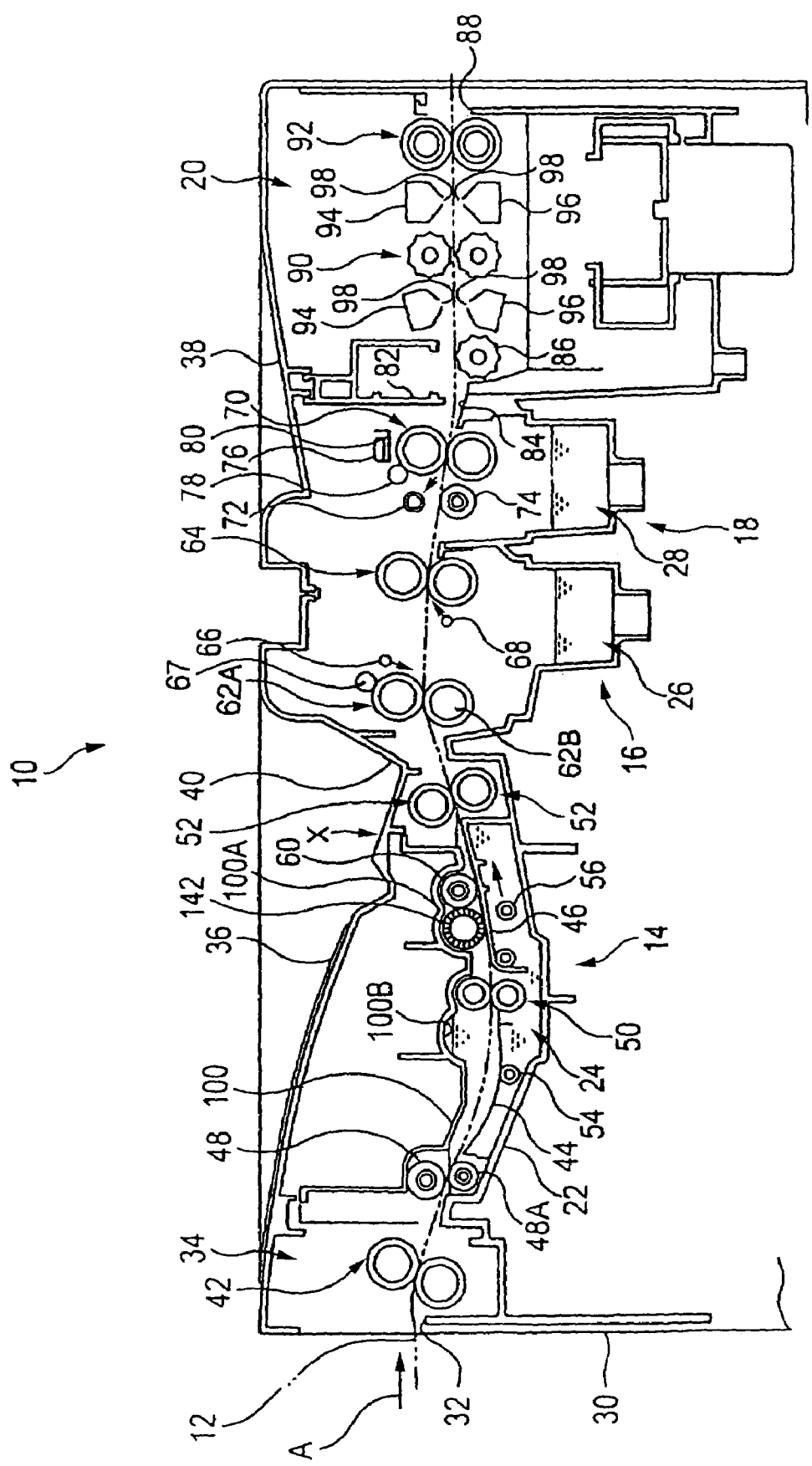
FIG. 1 is a schematic cross sectional view showing a constitution of a printing plate processor according to one embodiment of the invention.

Reference numerals are used to identify various elements in the drawings including the following:
10 printing plate processor
12 printing plate
14 developing part
16 rinsing part
18 finishing (moistening) part
20 drying part
22 processing tank
24 developing bath
26 rinsing bath
28 finishing bath
30 outer panel
32 feeding slot
34 feeding part
36 cover for feeding slot
38 cover for drying part
40 reentry slot (auxiliary feeding slot)
42, 48, 50, 52 pair of conveying rollers
60 conveying roller
62A flat roller
62B, 62B2 roller having concavo-convex surface
62B1 roller having grooves
64 pair of conveying rollers
66, 68 spray pipe
M meniscus
D1 convex part
B1-B4 concave part

DETAILED DESCRIPTION OF THE INVENTION

The invention will be described in detail with reference to the following embodiments.

The invention relates to, as one embodiment, a developing apparatus for a lithographic printing plate having a photosensitive material coated thereon, and particularly, a processing apparatus for a lithographic printing plate that is image wise exposed with a high definition AM screen or an FM screen. The invention is effective particularly for processing a lithographic printing plate that contains a photothermal conversion agent, and is exposed with laser in a heat mode. One of the characteristic features of the invention is to prevent image unevenness from occurring due to dripping from the rinsing part.

FIG. 1 is a schematic cross sectional view showing a constitution of a printing plate processor according to one embodiment of the invention. The printing plate processor 10 processes a photosensitive lithographic printing plate having been exposed with an exposing device, which is not shown in the figure, through a high definition AM screen, an FM screen or a hybrid screen. The exposing device varies depending on the system, and in the case of the CTP prepress system, the photosensitive lithographic printing plate is directly exposed to image data without media using a semiconductor laser, a gas laser or a solid laser. Prior to the exposure, the image data is processed with a raster image processor (RIP) to form an image pattern necessary of exposure. An AM screen with 250 lines or more, an FM screen and a hybrid screen having both of them may be used as the image pattern. In particular, an FM screen and a hybrid screen are being quickly brought into the market in recent years. For example, Staccato 10, 20, 25, 35 and 36, produced by Creo Inc., are frequently used, and Randot and Randot 10, 15 and 20, produced by Dainippon Ink And Chemicals, Inc., Stainscreening, produced by Heidelberg, and Cristal Raster, produced by Agfa, are also brought into the market as an FM screen. As for a hybrid screen, Fairdot, produced by Dainippon Ink And Chemicals, Inc., and Sublima, produced by Agfa, are brought into the market. As for an AM screen, those capable of handling a high definition image, such as Co-Re Screen, produced by Fuji Photo Film Co., Ltd., can be applied in addition to the conventional ones handling a halftone dot image.

The printing plate processor 10 generally has a developing part for processing a photosensitive lithographic printing plate with a developing solution, a rinsing part for rinsing the lithographic printing plate, a finishing part for coating a gum solution on the rinsed lithographic printing plate to effect a moistening treatment, and a drying part for drying the lithographic printing plate ejected from the finishing part. The invention is not limited to the aforementioned general constitution and can be applied to an apparatus having a developing mechanism containing at least a developing part and a rinsing part.

The printing plate processor 10 specifically has a developing part 14 for processing a printing plate 12 with a developing solution, a rinsing part 16 for rinsing the printing plate 12, which has been processed with a developer solution, by brushing the plate surface with rinsing water fed thereon, a finishing part 18 for coating a gum solution for protecting the plate surface on the rinsed printing plate 12 to effect a moistening treatment, and a drying part 20 for drying the printing plate 12. That is, the printing plate processor has the developing step, the rinsing step, the finishing step and the drying step arranged in this order in the conveying direction of the printing plate 12, which is shown by the arrow A in FIG. 1.

The printing plate processor 10 has a processing tank 22 inside. The processing tank 22 has processing baths including a developing bath 24 at the position corresponding to the developing part 12, a rinsing bath 26 at a position corresponding to the rinsing part 18, and a finishing bath 28 at a position corresponding to the finishing part 18. The processing tank 22 has a space for a feeding part 34 on the upstream side (upstream side in the conveying direction of the printing plate 12) of the developing bath 24, and a space for the drying part 20 on the downstream side of the finishing bath 28.

An outer panel 30 covering the processing tank 22 has a feeding slot 32 in a slit form on the side where the printing plate 12 is fed to the printing plate processor (left side of FIG. 1), and the processing tank 22 has the feeding part 34 on the side of the feeding slot 32.

The printing plate processor has covers 36 and 38 covering an upper part of the processing tank 22 and an upper part of the drying part 20. The cover 36 on the side of the feeding slot 32 covers an upper part of the processing tank 22 at the feeding part 34 to the rinsing part 16, and the cover 38 covers the upper part thereof at the rinsing part 16 to the drying part 20.

The cover 36 has a reentry slot (auxiliary feeding slot) 40 for feeding the printing plate 12 between the developing part 14 and the rinsing part 16. The auxiliary feeding slot 40 is provided for processing a thermal positive printing plate 12 with all the parts of the printing plate processor 10 except for the developing part 14.

A pair of conveying rollers 42 formed with rubber is disposed in the feeding part 34 adjacent to the feeding slot 40. The printing plate 12 exposed on both surface thereof is fed through the feeding slot 32 in the direction shown by the arrow A between the conveying roller 42.

The pair of conveying rollers 42 are rotationally driven to withdraw the printing plate 12 from the feeding slot 32 and to feed it to the developing part 14 at an angle of about from 15 to 31° with respect to the horizontal direction. In the case where a single-sided printing plate 12 (12, 12C) is processed, the printing plate is fed through the feeding slot 23 with the photosensitive layer (photosensitive surface) facing upward. That is, the printing plate 12 is processed with the printing plate processor with the photosensitive surface thereof facing upward.

The developing bath 24 formed in the processing tank 22 has a substantially angular shape having a bottom center protruding downward, in which a developer solution for developing the printing plate 12 is retained.

The developing bath 24 has inside a conveying roller 48 on the side of the feeding part 34, i.e., the upstream side of the conveying path of the printing plate 12. The developing bath 24 has inside a pair of conveying rollers 50 at the center part of the conveying path of the printing plate 12, and a pair of conveying rollers 52 on the side of the rinsing part 16, i.e., the downstream side.

The developing bath 24 has, between the conveying roller 48 and the pair of conveying rollers 50 and between the pair of conveying rollers 50 and the pair of conveying rollers 52, a conveying members, such as a guide plate and a conveying roller, a brush roller used as a scrubbing member, and a roller or a guide plate for backing up, so as to form a conveying path having a substantially U-shape for conveying the printing plate 12 immersed in the developing solution in the developing bath 24.

The developing bath 24 has inside a brush roller 142 and a conveying roller 60 between the pairs of conveying rollers 50 and 52. The brush roller 142 is used as an example of the scrubbing member, and the brush roller 142 and the conveying roller 60 are disposed to face the upper surface of the printing plate 12 being conveyed between the pairs of conveying rollers 50 and 52. The brush roller 142 is in contact with the upper surface of the printing plate 12 with rotating in a prescribed direction and a prescribed rotating direction, whereby the photosensitive layer on the upper surface of the printing plate 12 is brushed to facilitate removal of the unnecessary photosensitive layer with the developer solution.

The printing plate 12 withdrawn by the pair of conveying rollers 42 through the feeding slot 32 is passed under the conveying roller 48 and fed between the pair of conveying rollers 50, and further it is guided with the pair of conveying rollers 50 along the bottom surface of the developing bath 24 toward the pair of conveying rollers 52 in the obliquely upward direction. At this time, the upper surface of the printing plate 12 is brushed with the brush roller 142.

The pair of conveying rollers 52 is constituted, for example, by a roller having an outer peripheral part formed with rubber, and they hold the printing plate 12 to withdraw from the developer bath 24 and to feed to the rinsing part 16.

Spray pipes 54 and 56 are provided in the vicinity of the bottom surface in the developing bath 24 between the conveying roller 48 and the pair of conveying rollers 50 and between the pair of conveying rollers 50 and the pair of conveying rollers 52, respectively. The spray pipes 54 and 56 are supplied with the developer solution in the developing bath 24 aspirated with a pump, which is not shown in the figure, and the developer solution is sprayed from the spray pipes 54 and 56. According to the constitution, the developer solution in the developing bath 24 is agitated to effect uniform processing of the printing plate 12. At this time, the developer solution is sprayed from the spray pipe 54 in the width direction of the printing plate 12, which is perpendicular to the conveying direction thereof, whereby the developer solution thus sprayed from the spray pipe 54 runs around the front and back surfaces of the printing plate 12 conveyed in the developing bath 24 to effect uniform developing processing of the printing plate with processing unevenness being prevented from occurring.

The developing part is supplied with a prescribed amount of replenisher solution with a replenishing pump, which is not shown in the figure. The replenishing amount can be calculated from the width of the printing plate, which has been input in advance, and the length of the printing plate measured with a sensor provided at the feeding part. The replenishment may be effected at regular time intervals.

The replenishing amount may also be determined by change of the electro conductivity measured by an electro conductivity sensor, which is not shown in the figure, installed in the developing bath.

The printing plate 12 thus withdrawn from the developing bath 24 by the pair of conveying rollers 52 is fed to the rinsing part 16 while the developer solution attached to the surface thereof is squeezed by the pair of conveying rollers 52.

The rinsing part 16 has two pairs of rollers 62 and 64 and sprays 66 and 68. The printing plate 12 fed to the rinsing part 16 is held with the pair of feeding rollers 62. The upper feeding roller 62A is a flat roller, and the lower feeding roller 62B is a roller having a concavo-convex surface, i.e., a roller having a convex part and a concave part on the surface thereof.

Before feeding the printing plate 12 into the rinsing part, rinsing water is sprayed from the sprays, and the feeding rollers are exposed to the rinsing water. The rinsing water attached to the feeding rollers runs to the side of the developing part, but upon using the roller having a concavo-convex surface as the roller on side of the rinsing part, the amount of the rinsing water accumulated in the meniscus of the feeding rollers on the side of the developing part is significantly smaller than the case using a flat roller. Accordingly, dripping is prevented from occurring.

Figure 2A:
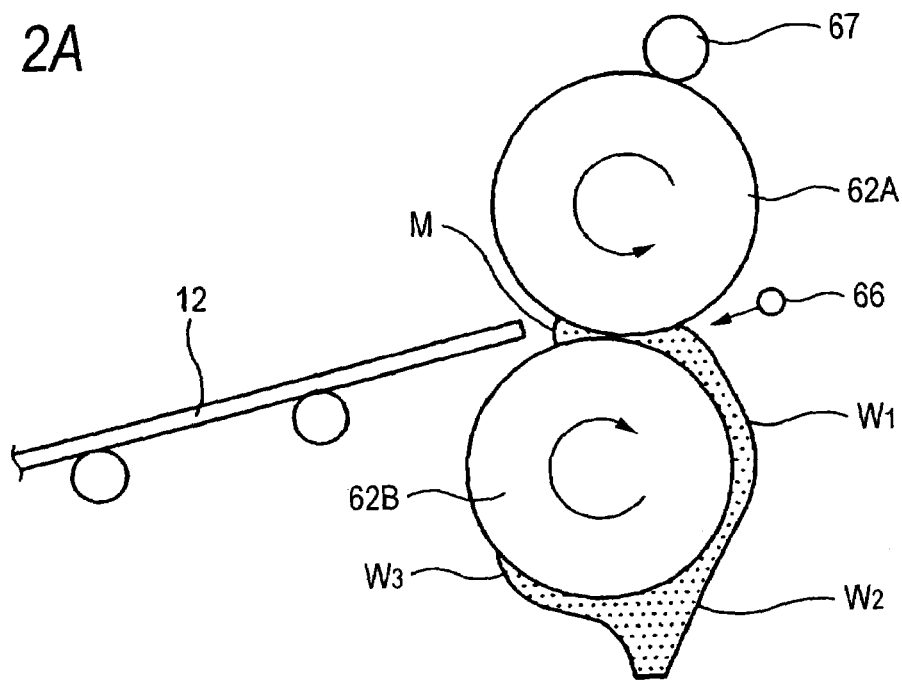
Figure 2B:
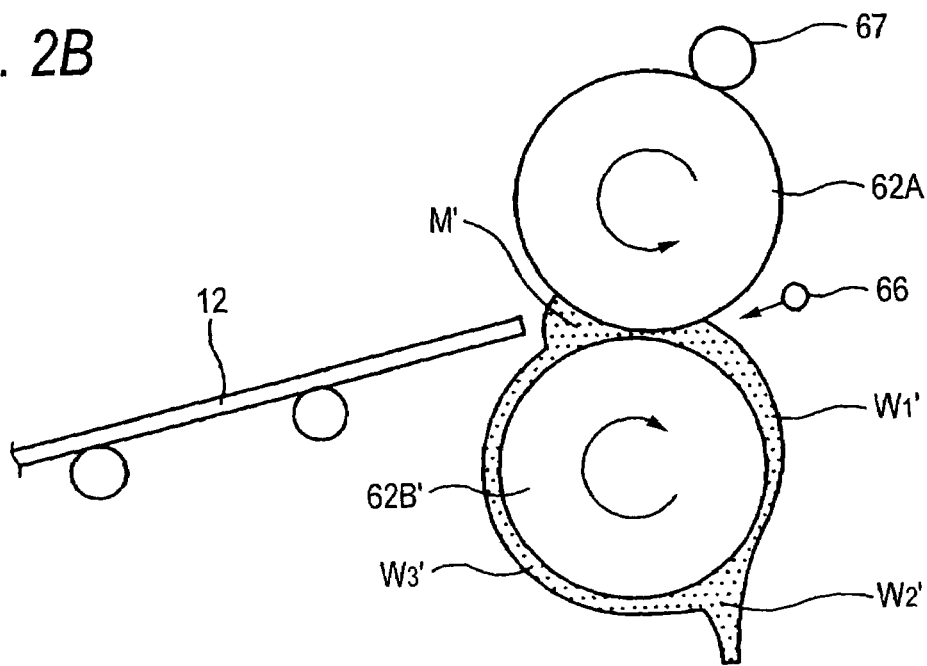

FIGS. 2A and 2B are schematic cross sectional views showing the states of rinsing with the upper and lower feeding rollers, in which FIG. 2A shows the state using the upper and lower feeding rollers according to the invention, and FIG. 2B shows the state using the upper and lower feeding rollers of the conventional apparatus. In the confessional apparatus shown in FIG. 2B, the rinsing water sprayed from the spray pipe 66 of the rinsing part hits against the upper and lower rollers 62A and 62B' at the feeding port of the rinsing part, and runs to the backside of the lower roller 62B' ($W_1'$) A certain part of the rinsing water running to the backside of the lower roller 62B' is attached to the surface thereof and falls down at the lower part of the roller ($W_2'$), but the remaining part thereof does not fall down but runs to the side of the developing part ($W3'$). As a result, a certain amount of the rinsing water is accumulated in the meniscus M' of the feeding rollers on the side of the developing part. Accordingly, upon feeding the lithographic printing plate 12 from the developing part, the rinsing water is dropped on the plate to cause dripping.

In the apparatus according to the invention shown in FIG. 2A, the rinsing water sprayed from the spray pipe 66 of the rinsing part hits against the upper and lower rollers 62A and 62B at the feeding port of the rinsing part, at which the rinsing water ($W_1$) attached to the lower roller 62B flows into the concavo-convex surface, and the most part thereof falls down at the lower part of the roller (W2). Accordingly, only a slight part of the rinsing water runs to the developing part side of the feeding rollers and accumulated in the meniscus M' of the feeding rollers on the side of the developing part. Therefore, upon feeding the lithographic printing plate 12 from the developing part, the rinsing water is not dropped on the plate to prevent dripping from occurring.

The printing plate fed to the rinsing part through the feeding rollers of the rinsing part is exposed to rinsing water with the spray 66 and ejected from the rinsing part with the pair of rollers 64.

The rinsing part 16 has the two pairs of rollers 62 and 64 above the rinsing bath 26 to form a conveying path for conveying the printing plate 12 in a substantially horizontal position, and the printing plate 12 is horizontally conveyed by holding with the pairs of conveying rollers 62 and 64 above the rinsing bath 26.

The spray pipes 66 and 68 are disposed between the pairs of the conveying rollers 62 and 64 above and under the printing plate 12, respectively. The upper roller 62A of the pair of conveying rollers 62 is provided with a metallic bar 67 in contact therewith for cutting the liquid.

The rinsing bath 26 retains rinsing water as a cleaning agent, and in the automatic developing apparatus 10, the rinsing water in the rinsing bath 26 is fed to the spray pipes 66 and 68 with a water feeding pump, which is not shown in the figure, by synchronizing with conveying of the printing plate 12. Accordingly, the rinsing water is sprayed from the spray pipes 66 and 68 to the printing plate 12 to flush away the developer solution attached to the surface of the printing plate 12.

The printing plate 12 is ejected by holding with the pair of conveying rollers 64, whereby the rinsing water supplied to the printing plate 12 is squeezed off from the back surface of the printing plate 12 along with the developer solution attached to the back surface of the printing plate 12 and is recovered to the rinsing bath 26. The spraying directions of the rinsing water from the spray pipes 66 and 68 are toward the upstream side of the conveying direction of the printing plate 12 for the spray pipe 66 and toward the downstream side of the conveying direction of the printing plate 12 for the spray pipe 68, but the directions are not limited to these and maybe other directions. The fresh liquid of the rinsing water is supplied to the rinsing bath 26 with a suitable means, which is not shown in the figure, corresponding to the processed amount of the printing plate 12.

An antiseptic for suppressing water stain and fungus from growing may be automatically added to the rinsing water. As a water stain preventing agent, BK-3, produced by Fuji Photo Film Co., Ltd., is preferably used.

The finishing part 18 has a pair of conveying rollers 70 above the finishing bath 28, and the printing plate 12 is conveyed with the pair of conveying rollers 64 toward the pair of conveying rollers 70, so as to pass in the finishing part 18, and then ejected to the drying part 20 by holding with the pair of conveying rollers 70.

The finishing part 18 has a spray pipe 72 above the conveying path of the printing plate 12, and a spray pipe 74 under the conveying path. The spray pipes 72 and 74 are disposed above and under the printing plate 12 intervening therebetween in such a manner that the longitudinal directions (axial directions) thereof are in the width direction of the printing plate 12. The spray pipes 72 and 74 have plural spraying holes arranged in the width direction of the thermal positive printing plate 12.

The finishing bath 28 retains a gum solution for protecting the plate surface of the printing plate 12, and the gum solution is supplied to the spray pipes 72 and 74 by synchronizing with conveying of the printing plate 12. The spray pipe 72 drops the gum solution on to the printing plate 12 and coated by spreading thereon. The spray pipe 74 sprays the gum solution from the spraying holes to the back surface of the printing plate 12 to coat the gum solution on the back surface of the printing plate 12.

The printing plate 12 is provided with a protective layer by the gum solution coated on the front and back surfaces thereof. The spraying direction of the gum solution from the spray pipe 72 is not limited to the direction toward the downstream side of the conveying direction of the printing plate 12 but may be other directions. The gum solution may also be coated on the surface of the printing plate 12 in such a manner that the gum solution is sprayed onto a rectifying plate to spread uniformly in the width direction of the printing plate 12 with the rectifying plate, and flowed down on the surface of the printing plate 12.

Instead of the spray pipe 74, the gum solution may be coated on the back surface of the printing plate 12 by using a discharging unit for coating the gum solution on the back surface of the printing plate 12 by discharging the gum solution while making the printing plate 12 in contact with the discharged gum solution.

The finishing part 18 has a rinsing spray 76 above the pair of conveying rollers 70 and has a rinsing roller 78 rotating in contact with the upper roller of the pair of conveying rollers 70. The rinsing spray 76 drops rinsing water through a rectifying plate 80 onto the contact position of the upper roller of the pair of conveying rollers 70 and the rinsing roller 78 to spread the rinsing water uniformly onto the peripheral surface of the upper roller of the pair of conveying rollers 70, whereby the gum solution is flushed away from the peripheral surfaces of the upper and lower rollers of the pair of conveying rollers 70, so as to prevent the thermal positive printing plate 12 from being damaged by the gum solution stuck on the peripheral surfaces of the rollers. The printing plate 12 coated with the gum solution in the finishing part 18 is held by the pair of conveying rollers 70 and conveyed toward the drying part 20 in such a state that the gum solution slightly remains on the front and back surfaces thereof (i.e., the gum solution remains as a thin film thereon).

The printing plate processor 10 has a partition plate 82 between the finishing part 18 and the drying part 20. The partition plate 82 is disposed above the conveying path of the printing plate 12 to face the upper end of the processing tank 22, so as to form a slit 84 between the finishing part 18 and the drying part 20. The partition plate 82 has a double structure forming an aeration path in a channel form on the side of the drying part 20 of the slot 84. The air in the drying part 20 flows into the aeration path to prevent the air in the drying part 20 from flowing into the finishing part 18 through the slot 84.

The drying part 20 has a supporting roller 86 for supporting the printing plate 12 in the vicinity of the slot 84, and has pair of conveying rollers 90 at the center part of the conveying path of the printing plate 12, and a pair of conveying rollers 92 in the vicinity of an ejecting slot 88. The thermal positive printing plate 12 is conveyed in the drying part 20 by the supporting roller 86 and the pairs of conveying rollers 90 and 92.

Pairs of ducts 94 and 96 are disposed to hold the conveying path of the printing plate 12 between the supporting roller 86 and the pair of conveying rollers 90 and between the pair of conveying roller 90 and the pair of conveying rollers 92. The ducts 94 and 96 are disposed in such a manner that the longitudinal directions thereof are in the width direction of the printing plate 12, and have slits 98 on the surfaces facing the conveying path of the printing plate 12.

The ducts 94 and 96 are supplied with dry air formed by a dry air forming means, which is not shown in the figure, from ends of the longitudinal direction. The dry air is blown from the slits 98 onto the conveying path of the printing plate 12 to dry the gum solution coated on the front and back surfaces of the printing plate 12, whereby a protective film is formed thereon.

The developing part 14 is provided with a shielding lid 100 with the lower surface thereof being positioned below the liquid surface of the developer solution retained in the developing bath 24, so as to reduce the area where the developer solution in the developing bath 24 is in contact with the air. The auxiliary feeding slot (reentry slot) 40 of the cover 36 is closed up with a shielding member, which is not shown in the figure, to prevent the ambient air from entering into the developing part 14.

The shielding lid 100 includes a concave part 10A, in which the brush roller 142 and the conveying roller 60 exposed from the liquid surface of the developer solution are housed, and a concave part 100B, in which the upper roller of the pair of conveying rollers 50 is housed along with auxiliary members described later in the case where they are provided.

The automatic developing apparatus 10 is equipped with the liquid surface lid 100 inside the developing bath 24 to prevent the developer solution from suffering deterioration and evaporation of water, which occur by contacting the developer solution with carbon dioxide in the air. It is a more preferred embodiment that a shielding member in a blade form, which is not shown in the figure, formed with silicone rubber or the like is provided on the shielding lid 100 and the processing tank 22 to be in contact with the conveying roller 48 and the pair of conveying rollers 52, whereby the developer solution is prevented from suffering contact with the ambient fresh air and evaporation of water.

The developing bath 24 of the automatic developing apparatus 10 has a conveying roller 48A under the conveying roller 48 to face the conveying roller 48. According to the constitution, the printing plate 12 is conveyed with the pair of conveying rollers 42 in the feeding part 34 to feed between the conveying rollers 48 and 48A. The conveying roller 48A is rotated by following the conveying roller 48 rotationally driven, and withdraws the printing plate 12 inserted between the conveying rollers 48 and 48A into the developing bath 24.

The developing bath 24 is equipped with a guide plate 44 between the conveying roller 48 and the pair of conveying rollers 50, and the guide plate 44 guides the printing plate 12 withdrawn by the conveying rollers 48 and 48A to feed between the pair of conveying rollers 50 at a prescribed angle.

A guide plate 46 is disposed between the pair of conveying rollers 50 and the pair of conveying rollers 52. The guide plate 46 guide the thermal positive printing, plate 12 fed by the pair of conveying rollers 50 toward the pair of conveying rollers 52 along the bottom surface of the developing bath 24.

The guide plate 46 is disposed to face the brush roller 142 and the conveying roller 60. The brush roller 142 holds the printing plate 12, which is conveyed on the upper surface of the guide plate 46, with the guide plate 46 under a prescribed brush pressure. Upon rotationally driving the brush roller 142 in the prescribed direction in this state, the brush roller 142 brushes the surface of the printing plate 12 to facilitate removal of the photosensitive layer immersed in the developer solution. The conveying roller 60 prevents the printing plate 12, which is conveyed on the guide plate 46 while brushing with the brush roller 142, from floating from the guide plate 46, whereby the printing plate 12 is certainly guided on the guide plate 46 toward the pair of conveying rollers 52.

The materials used in the developing system will be described.

The photosensitive lithographic printing plate capable of being applied to the alkali developer solution of the invention is not particularly limited, and examples thereof include various lithographic printing plate that has a support having formed thereon an image recording layer, such as a photosensitive layer and a thermal sensitive layer. Examples of the image recording layer include a thermal positive type disclosed in JP-A-7-285275 and Japanese Patent Application No. 2002-154279, a thermal negative type disclosed in JP-A-7-20625 and JP-A-11-218903, and a photopolymer negative type disclosed in JP-A-2001-100412 and JP-A-2002-169282.

Preferred examples of the lithographic printing plate include a multilayer thermal positive type disclosed in JP-A-11-218914, Japanese Patent Application No. 2002-499707, Japanese Patent Application No. 2003-189095 and Japanese Patent Application No. 2003-181121. The multilayer thermal positive lithographic printing plate may have a multilayer structure having two or more layers.

The developer solution used in the invention generally contains an alkali agent. The developer solution and the developing replenisher solution used for development in the invention may be an alkali aqueous solution having pH of from 10.0 to 13.5, and preferably from 11.0 to 13.3. Examples of the developer solution and the developing replenisher solution include alkali aqueous solutions having been known in this field of art. Examples of the alkali agent include an inorganic alkali agent, such as sodium silicate, potassium silicate, sodium triphosphate, potassium triphosphate, ammonium triphosphate, sodium diphosphate, potassium diphosphate, ammonium diphosphate, sodium bicarbonate, potassium bicarbonate, ammonium bicarbonate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide, and an organic alkali agent, such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

Preferred examples of the alkali agent include an aqueous solution of a silicate salt, such as sodium silicate and potassium silicate. This is because the pH and the developing property can be controlled by adjusting the ratio of silicon oxide $SiO_2$ and an alkali metal oxide $M_2O$ (which is generally shown by a molar ratio of $[SiO_2]/[M_2O]$) and the concentration thereof. For example, an aqueous solution of an alkali metal silicate salt having a molar ratio of $SiO_2/Na_2O$ of from 1.5 to 2.5 ($[SiO_2]/[Na_2O]$=1.5 to 2.5) and a concentration of $SiO_2$ of from 1 to 4% by weight is preferably used in the invention.

More preferred examples of the alkali agent include a buffer solution formed of a weak acid and a strong base. Examples of the weak acid used in the buffer solution include an acid having an acid dissociation constant (pKa) of from 10.0 to 13.3, and more preferably an acid having an acid dissociation constant (pKa) of from 11.0 to 13.1. For example, sulfosalicylic acid having a third dissociation constant of 11.7 can be preferably used in the invention. In other words, a polybasic acid having at least one acid dissociation constant that is within the aforementioned range can be preferably used in the invention.

The weak acid may be selected from those disclosed in Ionization Constants of Organic Acids Inaqueous Solution, published by Pergamon Press Inc., and examples thereof include an alcohol compound, such as 2,2,3,3-tetrafluoropropanol-1 (pKa: 12.74), trifluoroethanol (pKa: 12.37) and tirchloroethanol (pKa: 12.24), an aldehyde compound, such as pyridine-2-aldehyde (pKa: 12.68) and pyridine-4-aldehyde (pKa: 12.05), a saccharide compound, such as sorbitol (pKa: 13.0), sucrose (pKa: 12.7), 2-deoxyribose (pKa: 12.61), 2-deoxyglucose (pKa: 12.51), glucose (pKa: 12.46), galactose (pKa: 12.35), arabinose (pKa: 12.34), xylose (pKa: 12.29), fructose (pKa: 12.27), lipose (pKa: 12.22), mannose (pKa: 12.08) and L-ascorbic acid (pKa: 11.34), a compound having a phenolic hydroxyl group, such as salicylic acid (pKa: 13.0), 3-hydroxy-2-naphthoic acid (pKa: 12.84), catechol (pKa: 12.6), gallic acid (pKa: 12.4), sulfosalicylic acid (pKa: 11.7), 3,4-dihydroxysulfonic acid (pKa: 12.2), 3,4-dihydroxybenzoic acid (pKa: 11.94), 1,2,4-trihydroxybenzene (pKa: 11.82), hydroquinone (pKa: 11.56), pyrogallol (pKa: 11.34) and resorcinol (pKa: 11.27), an oxime compound, such as 2-butaneoxime (pKa: 12.45), acetoxime (pKa: 12.42), 1,2-cycloheptanedioxime (pKa: 12.3), 2-hydroxybenzaldehydeoxime (pKa: 12.10), dimethylglyoxime (pKa: 11.9), ethanediamideoxime (pKa: 11.37) and acetophenoneoxime (pKa: 11.35), an amino acid, such as 2-quinolone (pKa: 11.76), 2-pyridone (pKa: 11.65), 4-quinolone (pKa: 11.28), 4-pyridone (pKa: 11.12), 5-aminovaleric acid (pKa: 10.77), 2-mercaptoquinoline (pKa: 10.25) and 3-aminopropionic acid (pKa: 10.24), a nucleic acid-related substance, such as fluorouracil (pKa: 13.0), guanosine (pKa: 12.6), uridine (pKa: 12.6), adenosine (pKa: 12.56), inosine (pKa: 12.5), guanine (pKa: 12.3), cytidine (pKa: 12.2), cytosine (pKa: 12.2), topoxanthine (pKa: 12.1) and xanthine (pKa: 11.9), and in addition, weak acids including diethylaminosulfonic acid (pKa: 12.32), 1-amino-3,3,3-trifluorobenzoic acid (pKa: 12.29), isoproylidenedisulfonic acid (pKa: 12.10), 1,1-ethylidenediphosphonic acid (pKa: 11.54), 1-hydroxy-1,1-ethylidenediphosphonic acid (pKa: 11.52), benzimidazole (pKa: 12.86), thiobenzamide (pKa: 12.8), picolinethioamide (pKa: 12.55) and barbituric acid (pKa: 12.5). Examples of the strong base combined with the weak acid include sodium hydroxide, ammonium hydroxide, potassium hydroxide and lithium hydroxide.

The alkali agent is used solely or in combination of two or more kinds thereof. Among the alkali buffers, a combination of slufosalicylic acid, salicylic acid, sucrose or sorbitol with sodium hydroxide or potassium hydroxide is preferred, and a combination of sorbitol with potassium hydroxide or sodium hydroxide is more preferred. The alkali agent is used after controlling the pH by adjusting the concentration and the combination.

(Surface Active Agent)

The developer solution and the replenisher thereof used in the invention may contain various kinds of surface active agents and organic solvents for acceleration of development, dispersion of development dusts, and improvement of ink affinity of the image part of the printing plate. Preferred examples of the surface active agent include an anionic series, a cationic series, a nonionic series and an amphoteric series.

(Development Stabilizer)

The developer solution and the replenisher thereof used in the invention may contain various kinds of development stabilizers. Preferred examples thereof include a polyethylene glycol adduct of sugar alcohol described in JP-A-6-282079, a tetraalkylammonium salt, such as tetrabutylammonium hydroxide, a phosphonium salt, such as tetrabutylphosphonium bromide, and an iodonium salt, such as diphenyliodonium chloride.

(Organic Solvent)

The developer solution and the replenisher thereof may contain an organic solvent depending on necessity. Preferred examples of the organic solvent include one having a solubility in water of about 10% by weight or less, and preferably 5% by weight or less. Examples thereof include 1-phenylethanol, 2-phenylethanol, 3-phenyl-1-propanol, 4-phenyl-1-butanonl, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine and N-phenyldiethanolamine. The content of the organic solvent is generally from 0.1 to 5% by weight based on the total amount of the solution used. The using amount of the organic solvent closely relates to the using amount of the surface active agent, and it is preferred that the amount of the surface active agent is increased when the amount of the organic solvent is increased. This is because in the case where the amount of the surface active agent is small but the amount of the organic solvent is large, the organic solvent is not completely dissolved to fail to expect good developing property.

(Reducing Agent)

The developer solution and the replenisher thereof may contain a reducing agent. The reducing agent is added for preventing the printing plate from being stained, and is particularly effective upon developing a negative photosensitive lithographic printing plate containing a photosensitive diazonium salt compound. Preferred examples of the organic reducing agent include a phenol compound, such as thiosalicylic acid, hydroquinone, metol, methoxyquinone, resorcin and 2-methylresorcin, and an amine compound, such as phenylenediamine and phenylhydrazine. More preferred examples of the inorganic reducing agent include sulfite, hydrogensulfite, phosphite, hydrogenphosphite, dihydrogenphosphite, thiosulfate and dithionite of sodium, potassium and ammonium. Among these reducing agents, a phosphite salt is excellent in stain preventing effect. The reducing agent is preferably added to the developer solution upon using in an amount of from 0.05 to 5% by weight.

(Organic Carboxylic Acid)

The developer solution and the replenisher thereof may further contain an organic carboxylic acid. Preferred examples of the organic carboxylic acid include an aliphatic carboxylic acid and an aromatic carboxylic acid each having from 6 to 20 carbon atoms. The using amount of the organic carboxylic acid may be from 0.1 to 10% by weight, and more preferably from 0.5 to 4% by weight, based on the amount of the developer solution upon using.

(Other Components)

The developer solution and the replenisher thereof may further contain a defoaming agent and a water softening agent. Examples of the water softening agent include polyphosphoric acid and sodium salt, potassium salt and ammonium salt thereof, an aminopolycarboxylic acid, such as ethylene diamine tetraacetic acid, diethylene triamine pentaacetic acid, triethylene tetramine hexaacetic acid, hydroxyethylethylene diamine triacetic acid, nitrilotriacetic acid, 1,2-diaminocyclohexane tetraacetic acid and 1,3-diamino-2-propanol tetraacetic acid, sodium salt, potassium salt and ammonium salt thereof, aminotri(methylenephosphonic acid), ethylene diamine tetra(methylenephosphonic acid), diethylene triamine penta(methylenephosphonic acid), triethylene tetramine hexa (methylenephosphonic acid), hydroxyethylethylene diamine tri(methylenephosphonic acid) and 1-hydroxyethane-1,1-diphosphonic acid, and sodium salts, potassium salts and ammonium salts of these acids. The water softening agent varies in suitable addition amount depending on its chelating power and the hardness and the amount of hard water, and the using amount is generally from 0.01 to 5% by weight, and preferably from 0.01 to 0.5% by weight, based on the amount of the developer solution upon using. In the case where the amount is less than the range, the intended effect cannot be obtained, and in the case where the amount exceeds the range, there arises adverse affect on the image part, such as decoloration.

The balance of the developer solution and the replenisher thereof is water, but various additives that have been known in this field of art may be added thereto depending on necessity.

It is advantageous for transportation that the developer solution and the replenisher thereof are stored as a concentrated solution with a small water content, which may be used after diluting with water. In this case, the concentration degree is suitably such an extent that the components are not separated or deposited.

By using the aforementioned developer solution in the invention, image defects can be further effectively suppressed from occurring.

Specific embodiments of the invention will be described below.

The concavo-convex surface formed on the lower roller 62B may be various forms. Herein, (1) a roller having grooves is described as a first embodiment, and then (2) another specific example of the concavo-convex surface, which includes the grooves, is then described as a second embodiment.

FIRST EMBODIMENT (Roller Having Grooves)

The grooves formed on the lower roller 62B may be in a ring form, but the grooves are not limited thereto and may be in a spiral form along the circumferential surface of the roller.

Figure 3A:
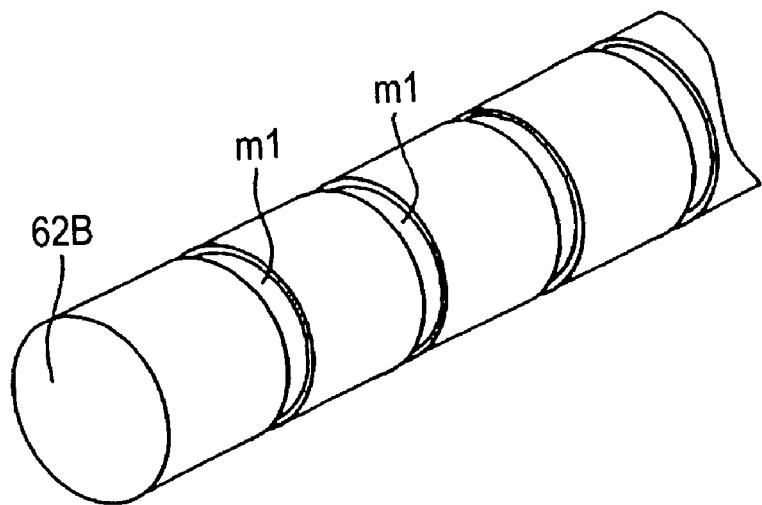
FIGS. 3A and 3B are perspective views showing rollers having grooves according to the invention, in which the roller shown in FIG. 3A has grooves in a ring form, and the roller shown in FIG. 3B has grooves in a spiral form.
Figure 3B:
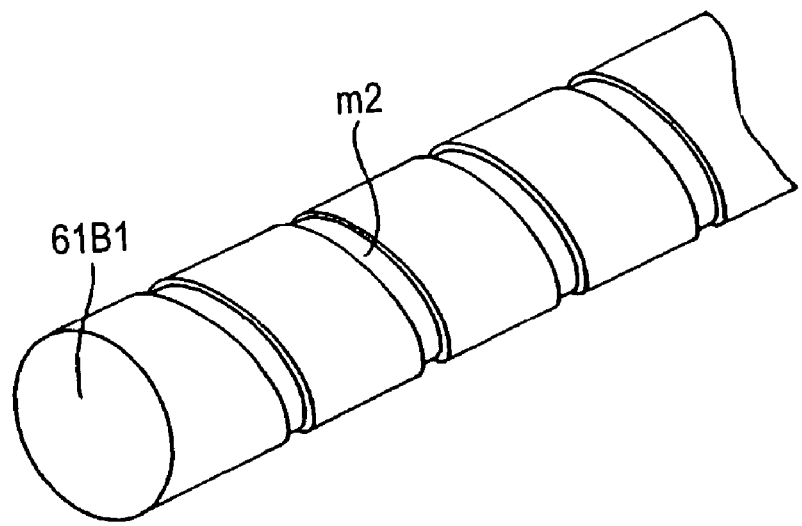

FIGS. 3A and 3B are perspective views showing rollers having grooves according to the invention, in which the roller shown in FIG. 3A has grooves in a ring form, and the roller shown in FIG. 3B has grooves in a spiral form.

In the figures, numeral 62B denotes a cylindrical roller having plural grooves m1 in a ring form provided in the circumferential direction, and 62B1 denotes a cylindrical roller having grooves m2 in a spiral form provided on the surface.

The grooved rollers 62B and 62B1 have a function of suppressing rinsing water from being accumulated in the meniscus part in a large amount, and are not limited in depth, width and number (density) of the grooves as far as they can suppress accumulation of rinsing water.

The grooves m1 and m2 will be described in detail. The depth of the grooves is 100 μm or more for attaining the function, and the depth, width and the density of the grooves can be appropriately determined as they influence each other. The depth is 100 μm or more and is preferably 400 μm or more for attaining certainly the function. The upper limit of the depth is not particularly determined, but grooves having a too large depth are difficultly cleaned. Therefore, the depth of the grooves is preferably 15 mm or less, and more preferably 5 mm or less.

The width of the grooves is 100 μm or more for attaining the function. The width of the grooves referred herein means a distance measured at the half height between the convex part and the concave part. The width of the grooves is 100 μm or more and is preferably 400 μm or more for attaining certainly the function. The width of the grooves is preferably not too large for preventing the proportion of the convex part from being reduced. One convex part is generally provided per 200 mm or less, and in the case where it is increased more than 200 mm, the printing plate is bent between the convex parts to impair the function. It is effective that one convex part is provided per 100 mm or less. The number of grooves that exerts the function depends on the length of the roller, and the density of the grooves is determined herein. The number of the grooves in a spiral form or a ring form is preferably from 1 to 10 per 100 mm in the lengthwise direction of the roller, and more preferably 1 or more per 50 mm for attaining certainly the function. In the case where the density of the grooves is less than the aforementioned value, there are cases where the function cannot be obtained. The widths of the concave part and the convex part are necessarily decreased when the density of the grooves is increased. The function is reduced when the widths of the concave part and the convex part are too reduced, and therefore, the number of grooves is preferably 1,000 or less per 100 mm in the lengthwise direction of the roller, and more preferably 300 or less per 100 mm. The grooves are generally provided periodically for easiness in manufacturing, but the grooves may not be provided periodically, and grooves having no periodicity can sufficiently exert the function.

The shape of the grooves is not particularly limited, and grooves having such a cross sectional shape as a rectangular shape, an angular shape and a sine curve shape are frequently used. The material for the roller having grooves may be those ordinarily used for a printing plate processor, such as rubber, and the roller can be obtained by appropriately fabricating the material. Materials other than rubber, such as a metal and plastics, may also be used.

The printing plate processor 10 shown in FIG. 1 generally has a developing part 14 for processing a photosensitive lithographic printing plate with a developing solution, a rinsing part 16 for rinsing the lithographic printing plate, a finishing part 18 for coating a gum solution on the rinsed lithographic printing plate to effect a moistening treatment, and a drying part 20 for drying the lithographic printing plate ejected from the finishing part.

As described hereinabove, the lithographic printing plate 12 ejected with the ejecting rollers in the developing bath is conveyed to the rinsing part.

The lithographic printing plate ejected from the developing part still has the developer solution remaining as a thin film thereon even after squeezing the developer solution with the squeezing rollers at the ejection port of the developing part, and the development slightly proceeds until the printing plate is fed to the rinsing part. The spray pipe of the rinsing part already discharges rinsing water, which is hit against the feeding rollers in the rinsing part before passing the lithographic printing plate. The upper roller of the feeding rollers in the rinsing part is provided with a metallic bar 67 to cut the rinsing water discharged from the spray pipe to suppress the rinsing water from running to the meniscus part of the rollers in the rinsing part on the side of the developing part. Even though the rinsing water is suppressed from running with the metallic bar, the rinsing water slightly runs around the upper roller, and in the case where a flat roller is used as the lower roller of the feeding rollers in the rinsing part, the rinsing water runs around the lower roller and is accumulated in the meniscus part of the rollers in the rinsing part. Upon passing a printing plate through the feeding rollers, the printing plate penetrates to the meniscus or passes the lower side of the meniscus, whereby the rinsing water flows on the surface of the printing plate to cause dripping. Even in the case where the position where the printing plate penetrates to the meniscus is adjusted, the rinsing water accumulated in the meniscus is liable to change in shape, and it is difficult to obtain stable capability. Upon processing a printing plate having punched holes on the edge thereof, the extent of dripping grows more serious because a large amount of the rinsing water flows through the punched holes to cause dripping. In the case where the position of the feeding rollers in the rinsing part is higher than the ejecting rollers of the developing part, the extent of dripping becomes further serious.

In the case where the dripping occurs, the development slightly proceeding is suppressed by the rinsing water on the dripping part in comparison to the part where no dripping occurs. There is such a tendency that lines of a halftone image are thinned with progress of development, and therefore, the thinning rate of lines in the dripping part is reduced due to suppression of development, which results in increase of the halftone dot area ratio. The phenomenon brings about image unevenness, which can be visually observed upon printing. A high definition image has a long image circumferential length, and thus slight fluctuation in progress of development due to the remaining developer solution largely influences the half tone dot are a ratio to cause image unevenness. Therefore, the effect of cutting the liquid on the feeding rollers in the rinsing part is significant for a high definition image. Specifically, a high definition image that is liable to suffer image unevenness includes an AM screen having 250 lines or more, an FM screen and a hybrid screen. In particular, an FM screen or a hybrid screen having a minimum pixel size constituting halftone dots of 50 μm or less, particularly 30 μm or less, is further liable to suffer image unevenness, to which the invention is effectively applied.

FIGS. 4A and 4B are diagrams for describing the minimum pixel size referred in the invention, in which FIG. 4A shows the minimum pixel found in a highlight part, and FIG. 4B shows the minimum pixel found in a halftone part. The minimum pixel size herein means the length of one edge of the minimum pixel constituting the image. As shown in the figures, the minimum pixel is found in the highlight part (FIG. 4A) and also found partly in the halftone part (FIG. 4B) and a shadow part.

In a thermal positive plate, lines are liable to thin to provide a tendency to increase the difference in halftone dot are a ratio between the dripping part and the part where no dripping occurs. The thermal positive plate has a single layer structure or a multilayer structure, and the thermal positive plate having photosensitive layers as a multilayer structure is liable to suffer image unevenness. In the thermal positive plate having a multilayer structure, the upper layer has a function of suppressing elution of the non-exposed part, and the lower layer is designed to be easily dissolved in a developer solution. Therefore, the elution is liable to occur on the side edge of the image part, so as to increase the extent of line thinning due to the remaining developer solution after dejecting from the developing bath. Accordingly, a large difference in density occurs between the part where the development is terminated by dripping and the part where no dripping occurs. The invention exerts significant advantage in the system of this kind.

In the case where a roller having grooves is used as the lower feeding roller in the rinsing part, even when rinsing water discharged from the rinsing spray pipe runs around to the side of the developing part, the rinsing water flows down along the grooves provided on the lower feeding roller in the rinsing part, whereby the amount of the rinsing water accumulated in the meniscus part becomes smaller than the case using a flat roller. In addition to the fact that the amount of the rinsing water accumulated in the meniscus part is small, the printing plate 12 is on the convex part on the roller, and the rinsing water is in the grooves, whereby the amount of the rinsing water flowing on the printing plate is extremely small. Accordingly, no dripping occurs on the printing plate to prevent image unevenness from occurring.

EXAMPLE

The advantages of the invention will be described in detail with reference to the following examples, but the scope of the invention is not limited to them.
(1) Lithographic Printing Original Plate HP-S Examples 1 to 4 and Comparative Examples 1 to 3

A lithographic printing original plate HP-S (a thermal positive multilayer plate, produced by Fuji Photo Film Co., Ltd.) was exposed to a 50% halftone with Trendsetter VX, produced by Creo Inc., at a beam intensity of 8 W and a drum rotational speed of 150 rpm through an FM screen, Staccato 20, and also through an AM screen of 175 lpi for reference, and then developed with an automatic developing apparatus having the constitution shown in FIG. 1 using a developer solution DT-2 (a developer solution for a thermal positive plate, produced by Fuji Photo Film Co., Ltd.) diluted with water at 1/8. The development was carried out at a temperature of the developer solution maintained at 30° C. and a developing time of 12 seconds. Water was used for rinsing in the rinsing part. For the finishing treatment, a finisher solution FG-1 (produced by Fuji Photo Film Co., Ltd.) was used after diluting at 1/1.

(7) Comparative Example 3: Flat roller with no groove

The exposure was carried out through the following screens.
(a) Co-Re Screen 250 lpi
(b) FM Staccato 20
(c) Randot 20
(d) Hybrid screen Fairdot
(e) AM screen 175 lpi It was understood from the results in Table 1 as follows.

(1) In the case where the depth and the width of the grooves were not less than 0.1 mm, no dripping occurred (A) irrespective to the shape of the grooves, i.e., the spiral grooves in Examples 1 and 3 and the ring grooves in Example 2, and no image unevenness was found in all the exposing modes (a) to (d).

(2) In the case where one of the depth and the width of the grooves was smaller than 0.1 mm (a depth of 0.08 mm in Comparative Example 1 and a width of 0.08 mm in Comparative Example 2), however, dripping occurred frequently though not always (BC), and image unevenness occurs was found in all the exposing modes (a) to (d).

(3) In the case using a flat roller having no groove, dripping always occurred (C), and image unevenness occurs was found in all the exposing modes (a) to (d).

(4) In the case where a conventional AM screen of 175 lpi was used (e), no dripping occurred (A) irrespective to the presence of grooves. It was understood therefrom that no

TABLE 1

Grooves of Lower Roller and Image Unevenness (Dripping)

| | Groove pattern | Groove depth | Groove width | Dripping | Co-Re screen 250 lpi | FM Staccarto 20 | Randot 20 | Hybrid screen Fairdot | AM screen 175 lpi |
|---|---|---|---|---|---|---|---|---|---|
| Example 1 | spiral | 0.6 mm | 0.6 mm | A | A | A | A | A | A |
| Example 2 | ring | 0.6 mm | 0.6 mm | A | A | A | A | A | A |
| Comparative Example 1 | spiral | 0.08 mm | 0.5 mm | BC* | (C) | (C) | (C) | (C) | A |
| Example 3 | spiral | 0.1 mm | 0.5 mm | A | A | A | A | A | A |
| Example 4 | spiral | 0.5 mm | 0.1 mm | A | A | A | A | A | A |
| Comparative Example 2 | spiral | 0.5 mm | 0.08 mm | BC | (C) | (C) | (C) | (C) | A |
| Comparative Example 3** | no groove | 0 mm | 0 mm | C | C | C | C | C | A |

Note:
*Dripping occurred upon passing frequently though not always, and image unevenness occurs upon occurrence of dripping.
**A Flat roller was used in Comparative Example 3.

Table 1 shows the experimental results indicating the shapes of grooves and the occurrence of dripping (i.e., the occurrence of image unevenness). The density of the grooves used in the experiments was about 80 per 100 mm.

The shapes of the grooves were as follows.
(1) Example 1: Spiral grooves with a depth of 0.6 mm and a width of 0.6 mm
(2) Example 2: Ring grooves with a depth of 0.6 mm and a width of 0.6 mm
(3) Example 3: Spiral grooves with a depth of 0.1 mm and a width of 0.5 mm
(4) Example 4: Spiral grooves with a depth of 0.5 mm and a width of 0.1 mm
(5) Comparative Example 1: Spiral grooves with a depth of 0.08 mm and a width of 0.5 mm
(6) Comparative Example 2: Spiral grooves with a depth of 0.5 mm and a width of 0.08 mm image unevenness due to dripping occurred upon exposing through the AM screen of 175 lpi, which was not a high definition screen. Therefore, it is understood that the problem of image unevenness is a phenomenon that is peculiar to high definition exposure, and dripping is a problem that is necessarily solved particularly in the case of high definition exposure.

(2) Lithographic Printing Original Plate LH-PD

Examples 5 to 7 and Comparative Example 4

A lithographic printing original plate LH-PD (a thermal positive multilayer plate, produced by Fuji Photo Film Co., Ltd.) was exposed to a 50% halftone with LUXEL T9000HS, produced by Fuji Photo Film Co., Ltd., at a beam intensity of 70% of the full power and a drum rotational speed of 900 rpm through an FM screen Randot X20 and a hybrid screen Fair dot, and also through an AM screen of 175 lpi for reference, and then developed with an automatic developing apparatus having the constitution shown in FIG. 1 using a developer solution DT-2 (a developer solution for a thermal positive plate, produced by Fuji Photo Film Co., Ltd.) diluted with water at 1/8. The development was carried out at a temperature of the developer solution maintained at 30° C. and a developing time of 12 seconds. Water was used for rinsing in the rinsing part. For the finishing treatment, a finisher solution FG-1 (produced by Fuji Photo Film Co., Ltd.) was used after diluting at 1/1.

TABLE 2

Grooves of Lower Roller and Image Unevenness (Dripping)

| | Groove pattern | Groove depth | Groove width | Dripping | Co-Re screen 300 lpi | FM Staccarto 10 | Randot 20 | Hybrid screen Fairdot | AM screen 175 lpi |
|---|---|---|---|---|---|---|---|---|---|
| Example 5 | ring | 0.5 mm | 0.5 mm | A | A | A | A | A | A |
| Example 6 | ring | 0.5 mm | 0.1 mm | A | A | A | A | A | A |
| Example 7 | ring | 0.1 mm | 0.5 mm | AB* | AB | AB | AB | AB | A |
| Comparative Example 4 | ring | 0.08 mm | 0.5 mm | C | C | C | C | C | A |

Note:
*Dripping occurred at low frequency upon passing a plate having punched holes, but the unevenness was in an acceptable level.

Table 2 shows the experimental results indicating the shapes of grooves and the occurrence of dripping (i.e., the occurrence of image unevenness). The density of the grooves used in the experiments was about 80 per 100 mm.

The shapes of the grooves were as follows.
(1) Example 5: Ring grooves with a depth of 0.5 mm and a width of 0.5 mm
(2) Example 6: Ring grooves with a depth of 0.5 mm and a width of 0.1 mm
(3) Example 7: Ring grooves with a depth of 0.1 mm and a width of 0.5 mm
(4) Comparative Example 4: Spiral grooves with a depth of 0.08 mm and a width of 0.5 mm The exposure was carried out through the following screens.
(a) Co-Re Screen 300 lpi
(b) FM Staccato 10
(c) Randot 20
(d) Hybrid screen Fairdot
(e) AM screen 175 lpi It was understood from the results in Table 2 as follows.

(1) In the case where the depth of the grooves was as large as about 0.5 mm (Example 5), no dripping occurred (A) even though the width of the grooves was small, and no image unevenness was found in all the exposing modes (a) to (d).

(2) In the case where the depth of the grooves was 0.1 mm (Example 6), however, dripping occurred at low frequency (BC) upon passing a plate having punched holes even though the width of the grooves was large, but the unevenness was in an acceptable level in all the exposing modes (a) to (d).

(3) In the case where the depth of the groove was less than 0.1 mm (Comparative Example 4), dripping occurred (C), and image unevenness occurs was found in all the exposing modes (a) to (d).

(4) In the case where a conventional AM screen of 175 lpi was used (e), no dripping occurred (A) irrespective to the presence of grooves. It was understood therefrom that no image unevenness due to dripping occurred upon exposing through the AM screen of 175 lpi, which was not a high definition screen. Therefore, it is understood that the problem of image unevenness is a phenomenon that is peculiar to high definition exposure, and dripping is a problem that is necessarily solved particularly in the case of high definition exposure.

As described hereinabove, according to the invention, a roller having grooves is used as the lower roller of the pair of feeding rollers in the rinsing part of the printing plate processor, whereby dripping from the feeding rollers in the rinsing part onto the surface of the printing plate is prevented from occurring, and image unevenness, which becomes a problem upon prepress of a high definition image, is prevented from occurring. Furthermore, the rinsing water can also be prevented from flowing into the developing bath. According to the invention, a lithographic printing plate can be processed with a printing plate processor without occurrence of image unevenness.

(Roller having Concavo-convex Surface)

A roller having a concavo-convex surface is used as the lower roller of the feeding rollers in the rinsing part in the second embodiment based on the finding, in which it is sufficient that the roller is not limited to the roller having grooves as in the first embodiment, and the depth and the shape of the concavo-convex surface are not limited as far as it can prevent a large amount of rinsing water from being accumulated in the meniscus part.

The concavo-convex surface preferably has such a shape that the convex part is in an is land form surrounded by the concave part, or the concave part is not segmentalized with the convex part in a circumferential direction of the roller.

Figure 5:
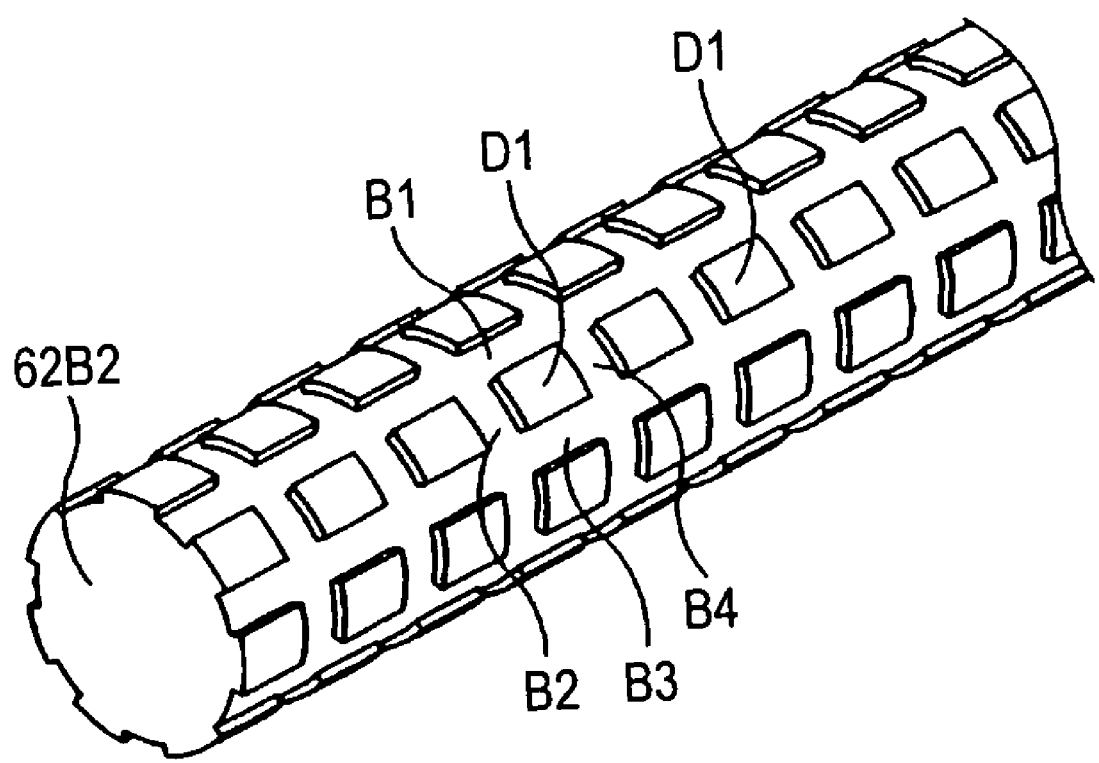
FIG. 5 is a perspective view showing an example of the roller having a concavo-convex surface according to the second embodiment of the invention.

FIG. 5 is a perspective view showing an example of the roller having a concavo-convex surface according to the invention.

In FIG. 5, numeral 62B2 denotes a roller having a concavo-convex surface having a number of convex parts D1 surrounded by concave parts B1 to B4.

The roller having a concavo-convex surface 62B2 has a function of preventing a large amount of rinsing water from being accumulated in the meniscus part, and the depth and width of the concave parts and the number of the concave and convex parts (density) may be such an extent that can prevent the rinsing water from being accumulated in the meniscus part.

The concave parts will be described in detail. The depth and the width of the concave parts are generally 100 μm or more, respectively, for attaining the function. The width referred herein means the distance measured at the half height between the convex part and the concave part. The concave parts and the convex parts may not be finished smoothly and may be such shapes that can exert the function.

As the concave parts that can exert the function, it is preferred that one or more concave parts are provided per 100 mm in the lengthwise direction of the roller, and more preferably per 50 mm in the lengthwise direction of the roller. There are cases where the function cannot be obtained when the number of the concave parts is less than the aforementioned value. The shape of the concave parts is not particularly limited, and the concave parts having such a cross sectional shape as a rectangular shape, an angular shape and a sine curve shape are frequently used. The material for the roller having a concavo-convex surface may be those ordinarily used for a printing plate processor, such as rubber, and the roller can be obtained by appropriately fabricating the material. Materials other than rubber, such as a metal and plastics, may also be used.

Upon using the roller having grooves in the first embodiment, in the case where the rinsing spray pipe is clogged to change the discharging direction of rinsing water to a position below the contact point of the upper roller and the lower roller of the feeding rollers, there are some cases where the rinsing water flows out from the concave parts of the groove and is accumulated in the meniscus part of the feeding rollers in the rinsing part on the side of the developing part, so as to cause dripping. In order to solve the problem, in the second embodiment, the stream of rinsing water is prevented from being directed to only the circumferential direction of the roller, but the flowing direction of the rinsing water is diffused. Furthermore, the roller having grooves in only one direction is difficult to clean the concave parts, and a prolonged period of time is required for cleaning the roller. The roller having a concavo-convex surface of the second embodiment can be easily cleaned with a brush member since the brush end can easily reach the concave parts.

The roller having grooves has such an advantage that the roller can be produced easily since the grooves are formed in only one direction, and thus the roller can be provided at low cost. The difficulty in cleaning the concave parts of the roller having grooves can be largely relaxed reducing the depth of the grooves and broadening the width of the grooves as much as possible within the permissible ranges.

The advantages of the invention will be described in detail with reference to the second embodiment, but the invention is not limited thereto.

(1) Lithographic Printing Original Plate HP-S

Examples 1 to 3 and Comparative Examples 1 to 4

A lithographic printing original plate HP-S (a thermal positive multilayer plate, produced by Fuji Photo Film Co., Ltd.) was exposed to a 50% halftone with Trendsetter VX, produced by Creo Inc., at a beam intensity of 8 W and a drum rotational speed of 150 rpm through an FM screen, Staccato 20, and also through an AM screen of 175 lpi for reference, and then developed with an automatic developing apparatus having the constitution shown in FIG. 1 using a developer solution DT-2 (a developer solution for a thermal positive plate, produced by Fuji Photo Film Co., Ltd.) diluted with water at 1/8. The development was carried out at a temperature of the developer solution maintained at 30° C. and a developing time of 12 seconds. Water was used for rinsing in the rinsing part. For the finishing treatment, a finisher solution FG-1 (produced by Fuji Photo Film Co., Ltd.) was used after diluting at 1/1.

TABLE 3

Roller with Concavo-convex surface and Image Unevenness (Dripping)

| | Roller | Concave part depth | Concave part width | Dripping | Co-Re screen 250 lpi | FM Staccarto 20 | Randot 20 | Hybrid screen Fairdot | AM screen 175 lpi | Cleaning of roller |
|---|---|---|---|---|---|---|---|---|---|---|
| Example 1 | concavo-convex | 0.6 mm | 0.6 mm | A | A | A | A | A | A | AB |
| Example 2 | concavo-convex | 0.8 mm | 5 mm | A | A | A | A | A | A | AB |
| Comparative Example 1 | concavo-convex | 0.09 mm | 0.3 mm | BC* | C | C | C | C | A | AB |
| Example 3 | concavo-convex | 0.1 mm | 0.2 mm | A | A | A | A | A | A | AB |
| Comparative Example 2 | concavo-convex | 0.3 mm | 0.08 mm | BC | C | C | C | C | A | AB |
| Comparative Example 3** | concavo-convex | 0 mm | 0 mm | C | C | C | C | C | A | A |
| Comparative Example 4*** | grooves | 0.6 mm | 0.6 mm | A | A | A | A | A | A | B |

Note:
*Dripping occurred upon passing frequently though not always, and image unevenness occurs upon occurrence of dripping.
**A Flat roller was used in Comparative Example 3.
***A roller having grooves (spiral form) was used in Comparative Example 4.

Table 3 shows the experimental results indicating the depth and width of the concave parts and the occurrence of dripping (i.e., the occurrence of image unevenness).

The shapes of the concavo-convex surface were as follows.

(1) Example 1: Roller having a concavo-convex surface with a depth of the concave part of 0.6 mm and a width of the concave part of 0.6 mm
(2) Example 2: Roller having a concavo-convex surface with a depth of the concave part of 0.8 mm and a width of the concave part of 5 mm
(3) Example 3: Roller having a concavo-convex surface with a depth of the concave part of 0.1 mm and a width of the concave part of 0.2 mm
(4) Comparative Example 1: Roller having a concavo-convex surface with a depth of the concave part of 0.09 mm and a width of the concave part of 0.3 mm (5) Comparative Example 2: Roller having a concavo-convex surface with a depth of the concave part of 0.3 mm and a width of the concave part of 0.08 mm
(6) Comparative Example 3: Flat roller with a depth of the concave part of 0 mm and a width of the concave part of 0 mm
(7) Comparative Example 4: Roller having spiral grooves with a depth of 0.6 mm and a width of 0.6 mm The exposure was carried out through the following screens.
(a) Co-Re Screen 250 lpi
(b) FM Staccato 20
(c) Randot 20
(d) Hybrid screen Fairdot
(e) AM screen 175 lpi The cleanability was evaluated as easiness in cleaning the rollers.

It was understood from the results in Table 3 as follows.
(1) In the case where the depth and the width of the concavo-convex surface were not less than 0.1 mm, no dripping occurred (A), and no image unevenness was found in all the exposing modes (a) to (d).
(2) In the case where one of the depth and the width of the concavo-convex surface was smaller than 0.1 mm (a depth of 0.09 mm in Comparative Example 1 and a width of 0.08 mm in Comparative Example 2), however, dripping occurred frequently though not always (BC), and image unevenness occurs was found in all the exposing modes (a) to (d).
(3) In the case using a flat roller having no concavo-convex surface, dripping always occurred (C), and image unevenness occurs was found in all the exposing modes (a) to (d).
(4) In the case where a conventional AM screen of 175 lpi was used (e), no dripping occurred (A) irrespective to the presence of the concavo-convex surface. It was understood therefrom that no image unevenness due to dripping occurred upon exposing through the AM screen of 175 lpi, which was not a high definition screen. Therefore, it is understood that the problem of image unevenness is a phenomenon that is peculiar to high definition exposure, and dripping is a problem that is necessarily solved particularly in the case of high definition exposure.
(5) The cleanability of the flat roller was naturally good, and that of the roller having a concavo-convex surface was in an acceptable level. The roller having grooves was inferior in cleanability.

(2) Lithographic Printing Original Plate LH-PD

Examples 4 to 6 and Comparative Examples 4 and 5

A lithographic printing original plate LH-PD (a thermal positive multilayer plate, produced by Fuji Photo Film Co., Ltd.) was exposed to a 50% halftone with LUXEL T9000HS, produced by Fuji Photo Film Co., Ltd., at a beam intensity of 70% of the full power and a drum rotational speed of 900 rpm through an FM screen Randot X20 and a hybrid screen Fairdot, and also through an AM screen of 175 lpi for reference, and then developed with an automatic developing apparatus having the constitution shown in FIG. 1 using a developer solution DT-2 (a developer solution for a thermal positive plate, produced by Fuji Photo Film Co., Ltd.) diluted with water at 1/8. The development was carried out at a temperature of the developer solution maintained at 30° C. and a developing time of 12 seconds. Water was used for rinsing in the rinsing part. For the finishing treatment, a finisher solution FG-1 (produced by Fuji Photo Film Co., Ltd.) was used after diluting at 1/1.

TABLE 4

Roller with Concavo-convex surface and Image Unevenness (Dripping)

| | Concave part depth | Concave part width | Dripping | Co-Re screen 300 lpi | FM Staccarto 10 | Randot 20 | Hybrid screen Fairdot | AM screen 175 lpi |
|---|---|---|---|---|---|---|---|---|
| Example 4 | 0.5 mm | 0.5 mm | A | A | A | A | A | A |
| Example 5 | 0.5 mm | 0.1 mm | A | A | A | A | A | A |
| Example 6 | 0.1 mm | 0.1 mm | AB* | AB | AB | AB | AB | A |
| Comparative Example 4 | 0.08 mm | 0.3 mm | C | C | C | C | C | A |
| Comparative Example 5 | 0.4 mm | 0.09 mm | C | C | C | C | C | A |

Note:
*Dripping occurred at low frequency upon passing a plate having punched holes, but the unevenness was in an acceptable level.

Table 4 shows the experimental results indicating the depth and width of the concave parts and the occurrence of dripping (i.e., the occurrence of image unevenness).

The shapes of the concavo-convex surface were as follows.
(1) Example 4: Roller having a concavo-convex surface with a depth of the concave part of 0.5 mm and a width of the concave part of 0.5 mm
(2) Example 5: Roller having a concavo-convex surface with a depth of the concave part of 0.5 mm and a width of the concave part of 0.1 mm
(3) Example 6: Roller having a concavo-convex surface with a depth of the concave part of 0.1 mm and a width of the concave part of 0.1 mm
(4) Comparative Example 4: Roller having a concavo-convex surface with a depth of the concave part of 0.08 mm and a width of the concave part of 0.3 mm
(5) Comparative Example 5: Roller having a concavo-convex surface with a depth of the concave part of 0.4 mm and a width of the concave part of 0.09 mm The exposure was carried out through the following screens.
(a) Co-Re Screen 250 lpi
(b) FM Staccato 10
(c) Randot 20
(d) Hybrid screen Fairdot
(e) AM screen 175 lpi It was understood from the results in Table 4 as follows.

(1) In the case where the depth and the width of the concavo-convex surface were not less than 0.1 mm, no dripping occurred (A), and no image unevenness was found in all the exposing modes (a) to (d).

(2) In the case where one of the depth and the width of the concavo-convex surface was smaller than 0.1 mm (a depth of 0.08 mm in Comparative Example 4 and a width of 0.09 mm in Comparative Example 5), however, dripping occurred (C), and image unevenness occurs was found in all the exposing modes (a) to (d).

(3) In the case both the depth and the width of the concavo-convex surface were about 0.1 mm, dripping occurred at low frequency upon passing a plate having punched holes even though the width of the grooves was large, but the unevenness was in an acceptable level in all the exposing modes (a) to (d)

(4) In the case where a conventional AM screen of 175 lpi was used (e), no dripping occurred (A) irrespective to the presence of the concavo-convex surface. It was understood therefrom that no image unevenness due to dripping occurred upon exposing through the AM screen of 175 lpi, which was not a high definition screen. Therefore, it is understood that the problem of image unevenness is a phenomenon that is peculiar to high definition exposure, and dripping is a problem that is necessarily solved particularly in the case of high definition exposure.

As described hereinabove, according to the second embodiment of the invention, a roller having a concavo-convex surface is used as the lower roller of the pair of feeding rollers in the rinsing part of the printing plate processor, whereby dripping from the feeding rollers in the rinsing part onto the surface of the printing plate is prevented from occurring, and image unevenness, which becomes a problem upon prepress of a high definition image, is prevented from occurring. Furthermore, the rinsing water can also be prevented from flowing into the developing bath. According to the invention, a lithographic printing plate can be processed with a printing plate processor without occurrence of image unevenness.

What is claimed is:

1. A processing apparatus for a lithographic printing plate, comprising: a developing process part and a rinsing process part so that the lithographic printing plate is subjected to a developing process and a rinsing process in this order, the rinsing process part comprising a pair of feeding rollers for holding and conveying the printing plate at a feeding port of the rinsing process part,
wherein a lower roller of the pair of feeding rollers has a concavo-convex surface comprising a convex part and a concave part, and the concave part has a depth of 100 µm or more and a width of 100 µm or more.

2. The processing apparatus according to claim 1, wherein the convex part is in an island form surrounded by the concave part.

3. The processing apparatus according to claim 1, wherein the concave part is not segmentalized with the convex part in a circumferential direction of the roller.

4. The processing apparatus according to claim 3, wherein the concave part comprises a groove.

5. The processing apparatus according to claim 4, wherein the groove is formed in one of a ring form and a spiral form.

6. The processing apparatus according to claim 1, wherein the concave part has a depth of 400 µm or more.

7. The processing apparatus according to claim 1, wherein the concave part has a width of 400 µor more.

8. The processing apparatus according to claim 1, wherein the concave part has a depth of 15 mm or less.

9. The processing apparatus according to claim 1, wherein the concave part has a depth of 5 mm or less.

10. The processing apparatus according to claim 1, wherein the concave part has a density of one or more groove per 100 mm in a lengthwise direction of the roller.

11. The processing apparatus according to claim 1, wherein the concave part has a density of one or more groove per 50 mm in a lengthwise direction of the roller.

12. The processing apparatus according to claim 1, wherein the number of the concave part is 1,000 or less per 100 mm in a lengthwise direction of the roller.

13. The processing apparatus according to claim 1, wherein the number of the concave part is 300 or less per 100 mm in a lengthwise direction of the roller.

14. The processing apparatus according to claim 1, wherein the lithographic printing plate comprises a material on which a photosensitive material for forming an image through one of an FM screen and a high definition AM screen is coated.

15. The processing apparatus according to claim 1, wherein the lithographic printing plate comprises a photo-thermal conversion agent, and is exposed with laser in a heat mode.

16. A process for processing a lithographic printing plate, the process comprising steps of:
exposing the lithographic printing plate comprising one of a photosensitive layer and a heat-sensitive layer with laser through a high definition AM screen having 250 lines or more or a high definition FM screen having a minimum pixel size constituting halftone dots of 50 µm or less;
developing the lithographic printing plate by conveying into a developing solution;
rinsing the lithographic printing plate; and
finishing the lithographic printing plate,
wherein a concavo-convex surface comprising a convex part and a concave part is formed on a lower roller of a pair of feeding rollers which hold and covey the lithographic printing plate ejected from an ejecting roller after completing the developing step, and a rinsing liquid is made to flow into the concave part, and wherein the concave part has a depth of 100 µm or more and a width of 100 µm or more.

17. The process according to claim 16, wherein the convex part is in an island form surrounded by the concave part.

18. The process according to claim 16, wherein the concave part is not segmentalized with the convex part in a circumferential direction of the roller.

19. The process according to claim 16, wherein the concave part comprises a groove.

20. The process according to claim 19, wherein the groove is formed in one of a ring form and a spiral form.

* * * * *